(12) United States Patent
Butzmann

(10) Patent No.: US 10,209,321 B2
(45) Date of Patent: Feb. 19, 2019

(54) EXTERNAL MAGNETIC FIELD ANGLE DETERMINATION

(75) Inventor: Stefan Butzmann, Beilstein (DE)

(73) Assignee: NXP B.V., Eindhoven (NL)

( * ) Notice: Subject to any disclaimer, the term of this patent is extended or adjusted under 35 U.S.C. 154(b) by 1132 days.

(21) Appl. No.: 12/598,500

(22) PCT Filed: Apr. 24, 2008

(86) PCT No.: PCT/IB2008/051593

§ 371 (c)(1),
(2), (4) Date: May 17, 2010

(87) PCT Pub. No.: WO2008/146184

PCT Pub. Date: Dec. 4, 2008

(65) Prior Publication Data

US 2010/0321014 A1    Dec. 23, 2010

(30) Foreign Application Priority Data

May 29, 2007  (EP) ...................................... 07109055

(51) Int. Cl.
*G01R 33/09*    (2006.01)
*B82Y 25/00*    (2011.01)
(Continued)

(52) U.S. Cl.
CPC ............ *G01R 33/093* (2013.01); *B82Y 25/00* (2013.01); *G01C 17/30* (2013.01); *G01D 5/145* (2013.01); *G01R 33/09* (2013.01); *G01R 33/096* (2013.01)

(58) Field of Classification Search
CPC .... G01R 33/09; G01R 33/091; G01R 33/093; G01R 33/095; G01R 33/096; G01R 33/098; B82Y 25/00; G01C 17/30; G01D 5/145
(Continued)

(56) References Cited

U.S. PATENT DOCUMENTS 3,771,044 A * 11/1973 Cohen et al. ................. 363/170
5,150,115 A *  9/1992 deJong et al. ........... 340/870.31
(Continued)

FOREIGN PATENT DOCUMENTS

CN        1300933 A     6/2001
DE     43 19 146 A1    12/1994
(Continued)

OTHER PUBLICATIONS

Richard, Linhart "A Three Axis Magnetometer for Use in a Small Satellite"; Applied Electronics, 2006; AE 2006; International Conference on, IEEE, PI; Sep. 1, 2006; pp. 113-116; XP031161105; ISBN: 978-80-7043-442-9.
(Continued)

*Primary Examiner* — David M Schindler
(74) *Attorney, Agent, or Firm* — Rajeev Madnawat

(57) ABSTRACT

Magnetoresistive sensors are commonly used for angular detection in many automotive applications. According to an exemplary embodiment of the present invention, a sensor is provided in which a first half-bridge has magnetoresistive resistors with barber-pole stripes and in which a second half-bridge has magnetoresistive resistors without barber-pole stripes. One of the resistors without barber-pole stripes is rotated with respect to the other three resistors by 90°. This may provide for an improved angle determination with reduced angular errors due to offset.

16 Claims, 6 Drawing Sheets

(51) Int. Cl.
*G01C 17/30* (2006.01)
*G01D 5/14* (2006.01)

(58) Field of Classification Search
USPC .......................................................... 324/252
See application file for complete search history.

(56) References Cited

U.S. PATENT DOCUMENTS

| | | | | |
|---|---|---|---|---|
| 5,241,268 | A | * | 8/1993 | Lee ........................... 324/207.25 |
| 5,680,042 | A | * | 10/1997 | Griffen et al. ............ 324/207.21 |
| 5,850,624 | A | * | 12/1998 | Gard et al. ....................... 702/92 |
| 5,945,825 | A | * | 8/1999 | Clemens ........................ 324/252 |
| 6,427,349 | B1 | * | 8/2002 | Blank et al. ..................... 33/356 |
| 6,566,872 | B1 | * | 5/2003 | Sugitani ......................... 324/249 |
| 6,943,544 | B2 | * | 9/2005 | Waffenschmidt ........ 324/207.21 |
| 7,005,958 | B2 | * | 2/2006 | Wan ............................ 338/32 R |
| 7,265,540 | B2 | * | 9/2007 | Sudo et al. .............. 324/207.21 |
| 7,528,606 | B1 | * | 5/2009 | In et al. ......................... 324/326 |
| 2002/0149358 | A1 | * | 10/2002 | Doescher ................. 324/207.21 |
| 2003/0201767 | A1 | * | 10/2003 | Khalfin .................... 324/207.17 |
| 2005/0016006 | A1 | * | 1/2005 | Sasagawa ................... 33/355 R |
| 2005/0150295 | A1 | * | 7/2005 | Wright ....................... 73/504.04 |
| 2006/0132125 | A1 | * | 6/2006 | Withanawasam ............. 324/252 |
| 2007/0047156 | A1 | * | 3/2007 | Cowburn et al. .......... 360/324.1 |

FOREIGN PATENT DOCUMENTS

| | | |
|---|---|---|
| DE | 196 48 335 A1 | 6/1998 |
| EP | 0 877 228 A | 11/1998 |
| EP | 1 249 686 A | 10/2002 |
| WO | 98/57188 A | 12/1998 |
| WO | 99/09427 A | 2/1999 |
| WO | 2005/054887 A | 6/2005 |
| WO | 2006/000963 A | 1/2006 |

OTHER PUBLICATIONS

Stork, Thomas; "Electronic Compass Design Using KMZ51 and KMZ52"; Philips Semiconductors—Application Note AN00022 Online; Mar. 30, 2000; pp. 1-38; XP002489426; http://www.nxp.com/acrobat_download/applicationnotes/AN0022_COMPASS.pdf; Retreived Jul. 10, 2008.

International Search Report dated Nov. 17, 2008 issued for PCT/IB2008/051593.

* cited by examiner

EXTERNAL MAGNETIC FIELD ANGLE DETERMINATION

The invention relates to the field of magnetic field angle determination. In particular, the invention relates to a sensor for measuring an angle of an external magnetic field, to a method for measuring an angle of an external magnetic field, a computer-readable medium and a program element.

Magnetoresistive sensors are commonly used for angular detection in many automotive applications, for example for paddle positioning or throttle control. The sensors currently in production and development make use of two Wheatstone bridges, which are rotated against each other by an angle of 45°.

If the angle α of an external magnetic field is changed the two bridges deliver signals with a phase difference of 45°. However, this sensor element may have a relatively high offset and the offset may drift over temperature. This may result in the need for a sophisticated offset compensation either by the customer or on the signal conditioning die.

It would be desirable to have an improved determination of a magnetic field angle.

The invention provides a sensor, a method, a program element and a computer-readable medium with the features according to the independent claims.

It should be noted that the following described exemplary embodiments of the invention apply also for the method for measuring the angle of the external magnetic field, the program element and the computer-readable medium.

According to a first aspect of the present invention, a sensor for measuring an angle of an external magnetic field on the basis of a magnetic field modulation is provided, the sensor comprising a first half-bridge, a second half-bridge and a modulation unit for modulating the magnetic field in two directions, wherein the first half-bridge has a first and a second magnetoresistive resistor with barber-pole stripes and wherein the second half-bridge has a third and a fourth magnetoresistive resistor without barber-pole stripes or with barber-pole stripes having a different orientation with respect to the barber-pole stripes of the first half-bridge.

In other words, the first half bridge may comprises a first resistor R2 and a second resistor R4. The second half-bridge may comprise a third resistor R1 (e.g. equal to R2) and a fourth resistor R3 (e.g. equal to R4). All four resistors have barber-pole stripes.

Alternatively, the third and the fourth magnetoresistive resistor do not have barber-pole stripes.

This may provide for an amplitude maximization of the sensor signal and therefore for an improved magnetic field angle determination.

According to another exemplary embodiment of the present invention, the modulation unit comprises a first coil for generating a magnetic modulation field in an x-direction, a second coil for generating the magnetic modulation field in a y-direction and an oscillator for exciting the first coil and the second coil in an alternating manner for generation of the magnetic modulation field.

In other words, a magnetoresistive Wheatstone bridge and two coils are provided, wherein two of the resistors have barber-pole stripes and the two other resistors do not have barber-pole stripes. The two coils are used for creating a magnetic modulation field in both x- and y-direction.

According to another exemplary embodiment of the present invention, the first coil and the second coil are both excited in a continuous manner for generation of the magnetic modulation field, wherein the first coil is excited by a sine-signal and wherein the second coil is excited by a cosine signal, such that the external magnetic field is superposed by a rotating magnetic field vector.

In this case, the alternating currents (AC) part of the resulting output signal has a phase shift compared to the original sine-signal, which is the same as the angle (or which is correlated to the angle for example by being proportional to the angle) of the external magnetic field.

According to another exemplary embodiment of the present invention, the calculation and control unit is further adapted for deciding, on the basis of the measured peak amplitudes, which one of the two half-bridges is used for calculation of the angle of the external magnetic field.

Furthermore, according to another exemplary embodiment of the present invention, a detector for detecting peak amplitudes which correspond to an output from the two half-bridges forms part of the sensor. Furthermore, the sensor comprises a calculation and control unit for calculating the angle of the external magnetic field according to:

$$\alpha = \arctan(U1pk/U2pk),$$

wherein U1pk and U2pk are the measured peak amplitudes.

Furthermore, according to another exemplary embodiment of the present invention, the third magnetoresistive resistor is rotated with respect to the forth magnetoresistive resistor by an angle of 90°, wherein the first magnetoresistive resistor and the second magnetoresistive resistor are arranged parallel to the third magnetoresistive resistor.

In other words, one half-bridge contains magnetoresistive resistors with barber-pole stripes and the other half-bridge contains magnetoresistive resistors without barber-pole stripes, but which are rotated against each other by 90°.

Alternatively, according to another exemplary embodiment of the present invention, the two half-bridges are rotated against each other by 45°, wherein each half-bridge comprises two parallel magnetoresistive resistors.

According to another aspect of the present invention, a method for measuring an angle of an external magnetic field on the basis of a magnetic field modulation is provided, in which the magnetic field is modulated in two directions by a modulation unit comprising a first half-bridge and a second half-bridge, wherein the first half-bridge has a first and a second magnetoresistive resistor with barber-pole stripes and wherein the second half-bridge has a third and a forth magnetoresistive resistor without barber-pole stripes.

This may provide for an improved magnetic field angle determination which may eliminate angular errors due to offset.

According to another exemplary embodiment of the present invention, the method further comprises the step of alternately generating a magnetic modulation field in an x-direction and in a y-direction.

According to another exemplary embodiment of the present invention, the method further comprises the steps of exciting the first coil and the second coil in a continuous manner for generation of the magnetic modulation field, wherein the first coil is excited by a sine-signal and wherein the second coil is excited by a cosine signal, such that the external magnetic field is superposed by a rotating magnetic field vector.

Furthermore, according to another aspect of the present invention, a computer-readable medium is provided, in which a computer program for measuring an angle of an external magnetic field on the basis of a magnetic field modulation is stored which, when being executed by a processor, causes the processor to carry out the above-mentioned method steps.

According to another aspect of the present invention, a program element for measuring an angle of an external magnetic field on the basis of a magnetic field modulation is provided which, when being executed by a processor, causes the processor to carry out the above-mentioned method steps.

These and other aspects of the present invention will become apparent from and elucidated with reference to the embodiments described hereinafter.

Exemplary embodiments of the present invention will now be described in the following, with reference to the following drawings.

The illustration in the drawings is schematically. In different drawings, similar or identical elements are provided with the same reference numerals.

Magnetoresistive sensors for angular sensing currently in production and development make use of two Wheatstone bridges, which are rotated against each other by an angle of 45°. If the angle α of an external magnetic field is changed the two bridges deliver signals with a phase difference of 45°.

These signals are usually amplified and converted to digital. In a following step the external magnetic field angle is calculated by $$\alpha = \frac{1}{2} * \arctan(U1/U2)$$

where U1 and U2 are the ouput voltages of the two Wheatstone bridges

Disadvantages of this method may be the relatively high offset of the sensor element and its offset drift over temperature, which cause a significant angular error. These drawbacks may result in the need for a sophisticated offset compensation on the signal conditioning die. A new element and new signal conditioning concept is proposed, which will eliminate angular errors due to offset and therefore eliminates the need for offset compensation.

This is achieved by modulating the external magnetic field with planar coils implemented on the sensor die.

Figure 1:
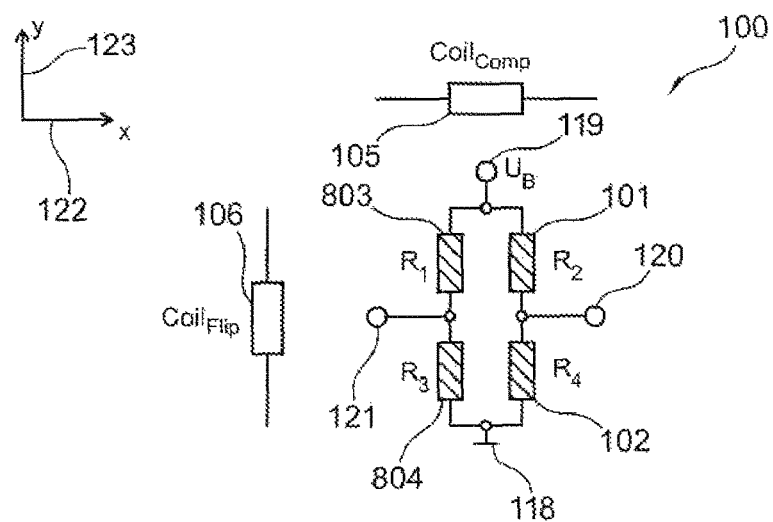
FIG. 1 shows a schematic representation of a compass sensor with flipping and compensation coils.

FIG. 1 shows a compass sensor with flipping and compensation coils on which the present invention is based. The sensor element depicted in FIG. 1 comprises one magnetoresistive Wheatstone bridge and two coils 105, 106 which are used for creating a magnetic field in both x- and y-direction.

The Wheatstone bridge comprises four magnetoresistive resistors 101, 102, 803 and 804. The connection between resistors 102 and 804 is connected to the ground 118. Furthermore, electric connections 119, 120 and 121 are provided between the resistors 101 and 803, 101 and 102, 803 and 804, respectively, for applying a signal or for measuring the sensor output.

The x- and y-directions are defined by access 122 and 123, respectively.

Such sensor elements are typically used in compass applications, where the flipping coil 106 is used to set the internal direction of magnetization of the Permalloy structures by applying short turn high current. This is done in order to prevent an accidental inversion of the elements transfer characteristic (flipping). The compensation coil 105 is in compass applications used to create a field opposite in size and direction to the external magnetic field. By this measure the magnetoresistive Wheatstone bridge (MR-Wheatstone bridge) is operated in a constant bias point in order to avoid non-linearity errors.

As may be seen from FIG. 1, the metallized stripes of the magnetoresistive resistors 101, 804 and 102, 803 result in a rotation of the current direction by ±45°.

In other words, the four resistors are adapted in the form of magnetoresistive resistors with pair-wise equal direction of the barber-pole stripes.

Figure 2:
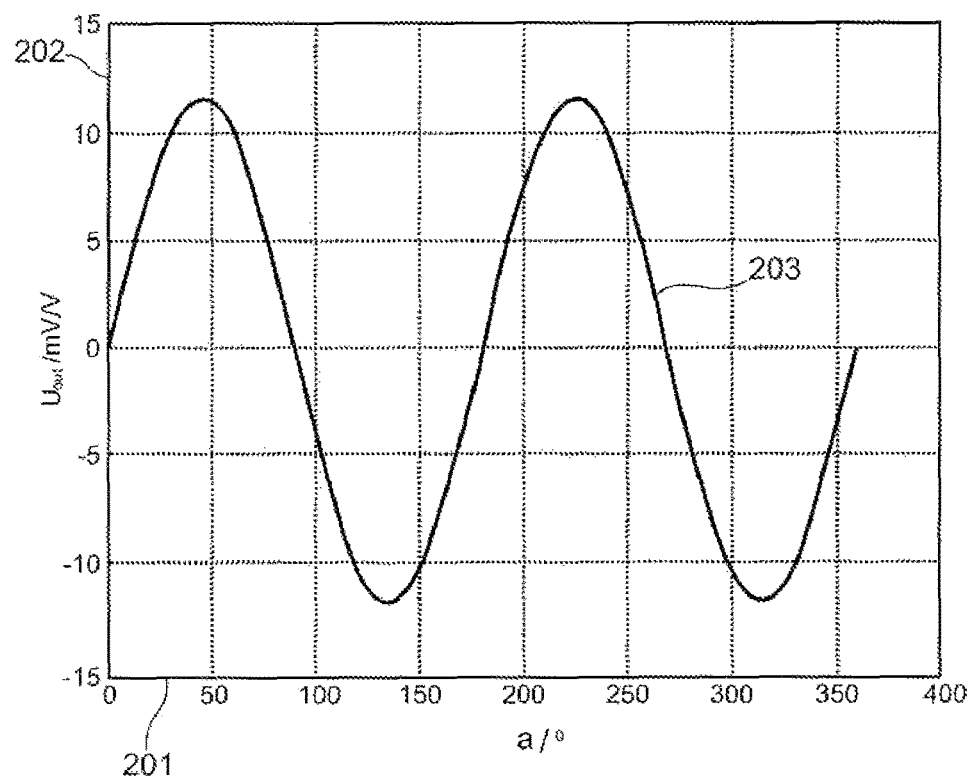
FIG. 2 shows an output signal of a sensor according to FIG. 1.

FIG. 2 shows the operation of the sensor of FIG. 1 in a saturating turning magnetic field without excitation of the integrated coils. If the sensor of FIG. 1 is operated in a strong magnetic field, the internal magnetization aligns with the external field direction and an output characteristic of the sensor as shown in FIG. 2 may be achieved.

The horizontal axis 201 depicts the angle α, ranging from 0° to 400°. The vertical axis 202 shows the output voltage $U_{out}$ in mV/V, ranging from −15 mV/V to +15 mV/V. Reference numeral 203 shows the output curve of the sensor.

As a reversal of the transfer characteristic due to flipping may only occur when sensing weak fields, the output is continuous because of the strength of the external magnetic field (sensor is operated in saturation). It is important to note, that in this mode of operation, the sensor output is only dependent on the direction of the magnetic field and not on the magnetic field strength.

Basic idea of the invention is to excite the two integrated coils alternatingly or simultaneously in order to modulate the direction of the external field vector and thus to modulate the output signal of the MR Wheatstone bridge.

Figure 3A:
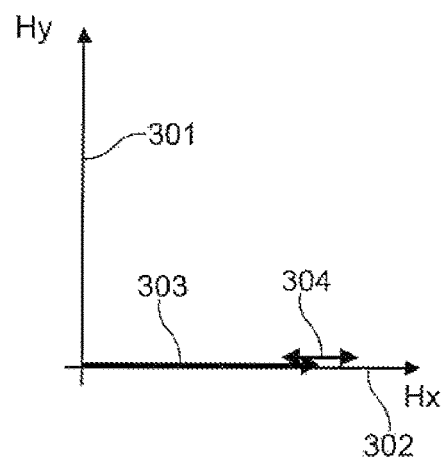
FIG. 3A and FIG. 3B show the effect on magnetic field vectors pointing into 0° direction when exciting the x- and y-coil alternatingly.
Figure 3B:
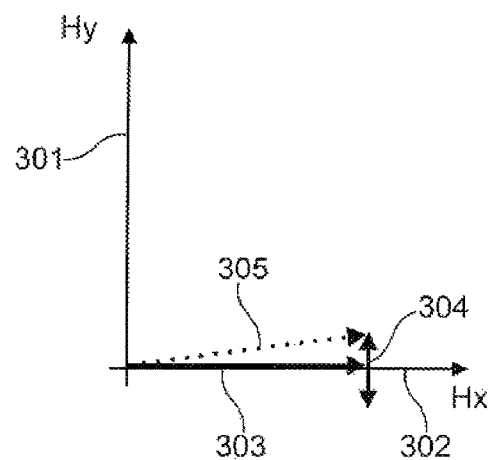

FIG. 3 shows the effect on the resulting magnetic field vector if an external magnetic field pointing into 0° direction is modulated with an AC-field in x-direction (see FIG. 3A) and with an AC-field in y-direction (see FIG. 3B).

The horizontal axis 302 shows the x-component of the magnetic field Hx and the vertical axis 301 shows the y-component of the magnetic field Hy. Reference numeral 303 references the electromagnetic field vector and reference numeral 304 shows the modulation field.

With an excitation in x-direction, the field direction and thus the output of the bridge is not changed at all, while an excitation with the other coil in y-direction (FIG. 3B) causes a change of the resulting magnetic field angle, which also causes a change of the output signal 305.

Figure 4A:
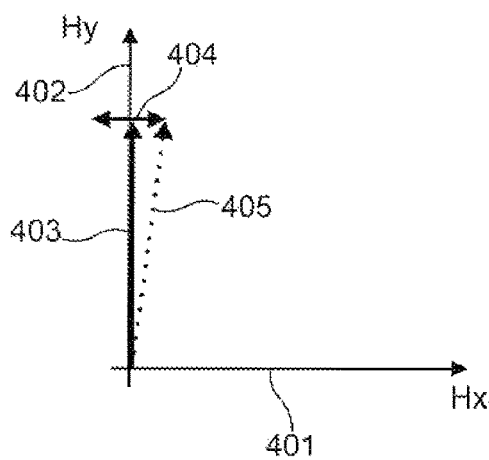
FIG. 4A and FIG. 4B show the effect on magnetic field vectors pointing into 90°-direction when exciting the x- and y-coil alternatingly.
Figure 4B:
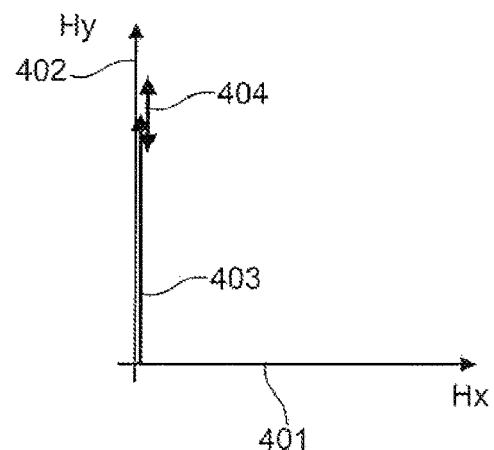

When the external magnetic field vector is turned by 90°, relations reverse, as depicted in FIGS. 4A and 4B.

The horizontal axis 401 again shows the x-component of the magnetic field Hx and the vertical axis 402 shows the y-component of the magnetization Hy. 403 shows the magnetic field vector and 404 shows the magnetic modulation field. In FIG. 4A the modulation field 404 is perpendicular to the external magnetic field 403 and in FIG. 4B the modulation field 404 is parallel to the external magnetic field 403.

405 shows the resulting magnetic field vector when the modulation field 404 points in positive x-direction.

For evaluation of the magnetic field angle a possible solution is therefore to excite the coils with an AC-magnetic field and to measure the resulting AC-amplitudes at the output of the Wheatstone bridge.

Figure 5:
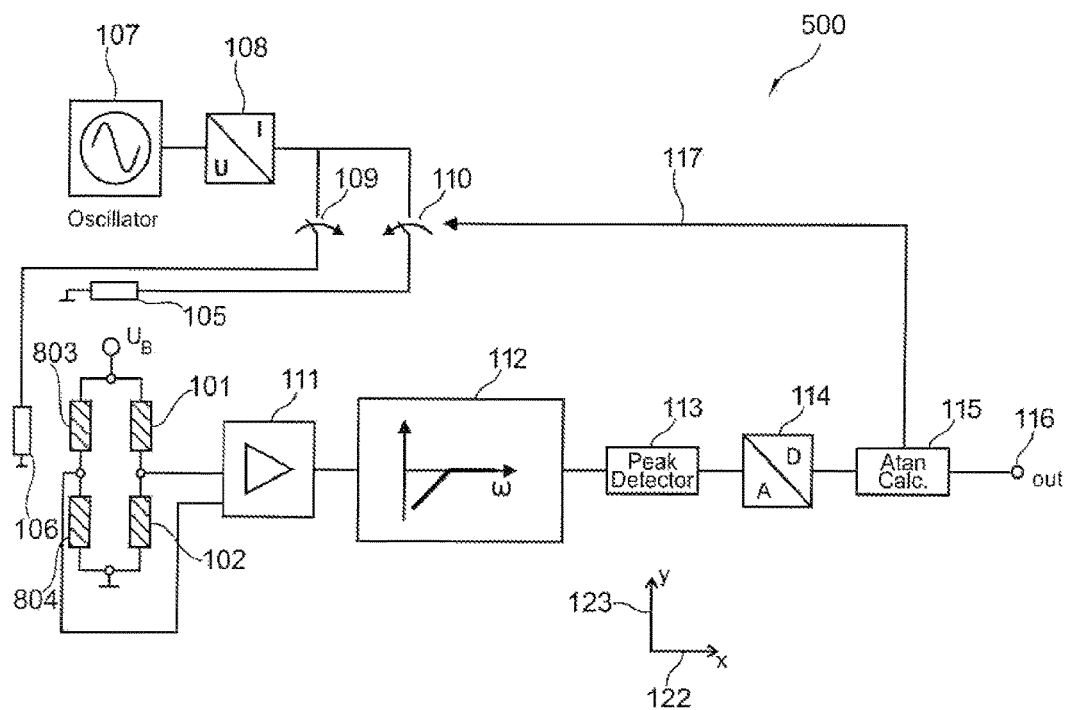
FIG. 5 shows a block diagram for a signal conditioning unit.

FIG. 5 shows a block diagram of a signal conditioning unit. The signal conditioning unit 500 may also be referred to as sensor device or simply sensor.

The signal conditioning unit or sensor 500 comprises an oscillator 107, a voltage-current-converter 108, switches 109, 110 and two coils 105, 106. In the context of this application these elements may be referred to as modulation unit.

The switches 109, 110 are adapted for providing an excitation of always one of the coils 105, 106.

The signal conditioning unit 500 further comprises the Wheatstone bridge with resistors 101, 102, 803 and 804, which is connected to an amplifier 111. In other words, the oscillator 107 excites always one of the coils 105, 106 and produces a magnetic field either in x- or in y-direction. The output of the magnetoresistive bridge is then amplified by the instrumentation amplifier 111.

The AC part is then filtered with a high-pass filter 112 and the amplitudes are measured, for example by a peak-detector 113 or a route mean square (RMS) detector. The measured amplitudes are then converted to digital by analog-to-digital converter 114 and the external field angle is calculated by the calculation unit 115 corresponding to:

$$\alpha = \arctan(U1pk/U2pk),$$

wherein U1pk and U2pk are the measured peak amplitudes.

The calculated value is then output by output 116. Furthermore, the calculation unit 115 is connected to the switches 109, 110 by line 117 for controlling the switches on the basis of the signal from the converter 114 or on the basis of the calculated signal.

The excitation signal generated by the oscillator 107 may have the form of a sine- or cosine signal or may have the form of a triangular signal or simply a step-like on/off signal or any other form.

An alternative way of evaluating is to constantly modulate both of the integrated excitation coils with sine- and cosine signals. In this case, the magnetic field vector of the external field is superposed by a rotating magnetic field vector as shown in FIG. 6.

In other words, the coil 105 is excitated by a sine-signal and the second coil 106 is excitated by a cosine signal.

Figure 6:
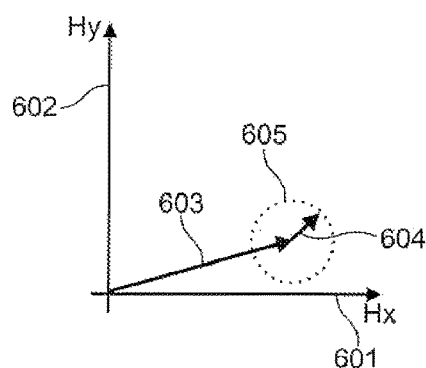
FIG. 6 shows a modulation of an external magnetic field by excitation of integrated coils with sine/cosine signals according to an exemplary embodiment of the present invention.

The horizontal axis in FIG. 6 depicts the x-component of the magnetic field and the y-axis 602 depicts the y-component of the magnetic field. The external magnetic field is referenced by numeral 603 and the modulation field is depicted by arrow 604, which rotates within the boundary of circle 605.

In this case, the AC part of the resulting output signal has a phase shift compared to the original sine-signal, which corresponds to or even is the same as the angle of the external magnetic field. This principle is shown in FIGS. 7A and 7B for an external magnetic field angle of 30°.

Figure 7A:
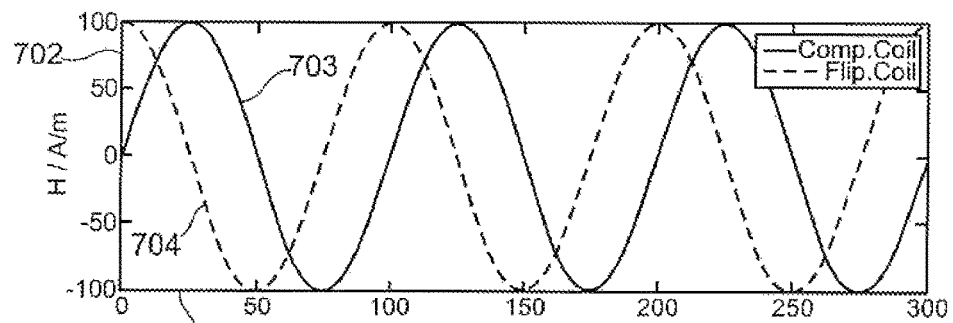
FIG. 7A shows coil excitation signals according to an exemplary embodiment of the present invention.

FIG. 7A shows the magnetic fields 703, 704 produced by the coils 105, 106 when excited with sine/cosine currents. The magnetic field 703 is generated by coil 105 and magnetic field 704 is generated by coil 106.

Figure 7B:
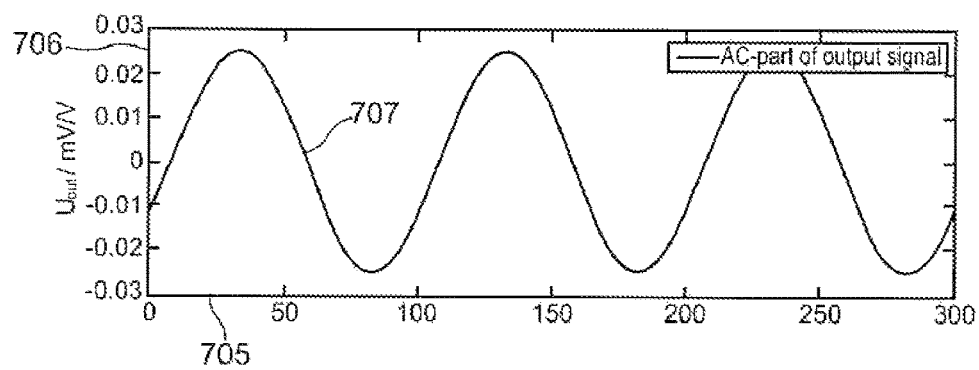
FIG. 7B shows an output signal from a magnetoresistive Wheatstone bridge for an external field angle of 30°, corresponding to the excitation signals of FIG. 7A.

The horizontal axis 701, 705 in FIGS. 7A and 7B depict the time in µs, ranging from 0 to 300 µs. The vertical axis 702 in FIG. 7A depicts the magnetic field H in units of A/m, ranging from −100 to +100 and the vertical axis in FIG. 7B depicts the output voltage $U_{out}$ in units mV/V, ranging from −0.03 mV/V to +0.03 mV/V. The curve 707 in FIG. 7B depicts the resulting output from the Wheatstone bridge.

The phase shift of the output signal relative to the coil excitation signals corresponds to the angle of the external magnetic field.

However, for reason of current consumption it may only be possible to modulate with small magnetic fields, which causes only small changes of the measured magnetic field angle. With respect to FIG. 2, it becomes obvious that this may yield extremely small amplitudes for field angles of periodically every 90° as the gradient of the output signal is 0 in these points.

Figure 8:
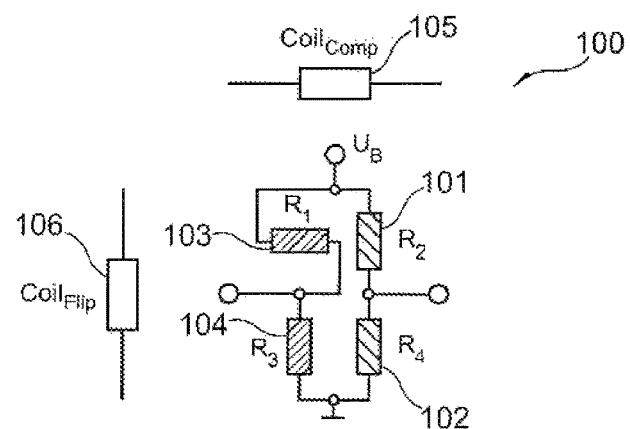
FIG. 8 shows a sensor for angular sensing according to an exemplary embodiment of the present invention.

For this reason, it is proposed to use a magnetoresistive sensor element configuration, in which one half-bridge contains magnetoresistive resistors with barber-pole stripes and the other half-bridge contains magnetoresistive resistors without barber-pole stripes, but which are rotated against each other by 90° (see FIG. 8).

As may be see from FIG. 8, the resistor 103 is rotated with respect to resistors 101, 102, 104 by 90°. Resistors 103, 104 do not contain barber-pole stripes and resistors 101, 102 do contain barber-pole stripes.

Alternatively, the two half-bridges may be rotated against each other by 45°.

Figure 9:
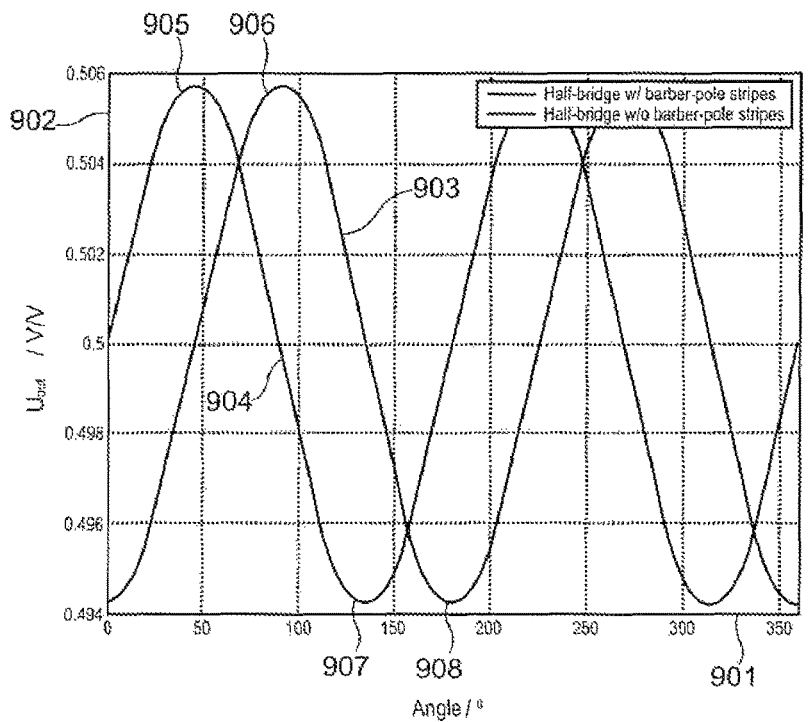
FIG. 9 shows output signals of two half-bridges of the sensor according to FIG. 8.

FIG. 9 shows the output signals 903, 904 of the two half-bridges with the modified structure depicted in FIG. 8. The horizontal axis 901 shows the angle α, ranging from 0 to 360°. The vertical axis 902 shows the output voltage in units V/V, ranging from 0.494 to 0.506.

The curve 903 shows the half-bridge output without barber-pole stripes and the curve 904 shows the half-bridge output of the half-bridge with barber-pole stripes.

As may be seen from FIG. 9, maxima 905, 906 and minima 907, 908 are offset against each other by 45°. By evaluating only the half-bridge with the larger amplitude, it may therefore be possible to always obtain an output signal of sufficient amplitude.

Figure 10:
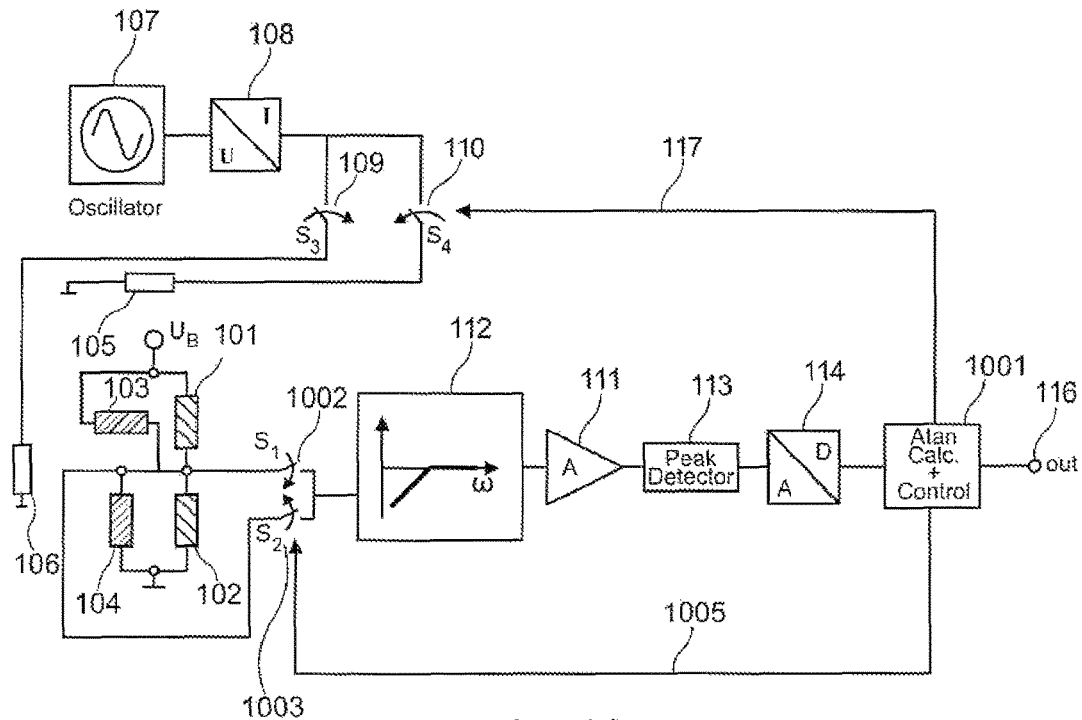
FIG. 10 shows a sensor device for angle calculation, comprising the sensor element of FIG. 8, according to an exemplary embodiment of the present invention.
Figure 11:
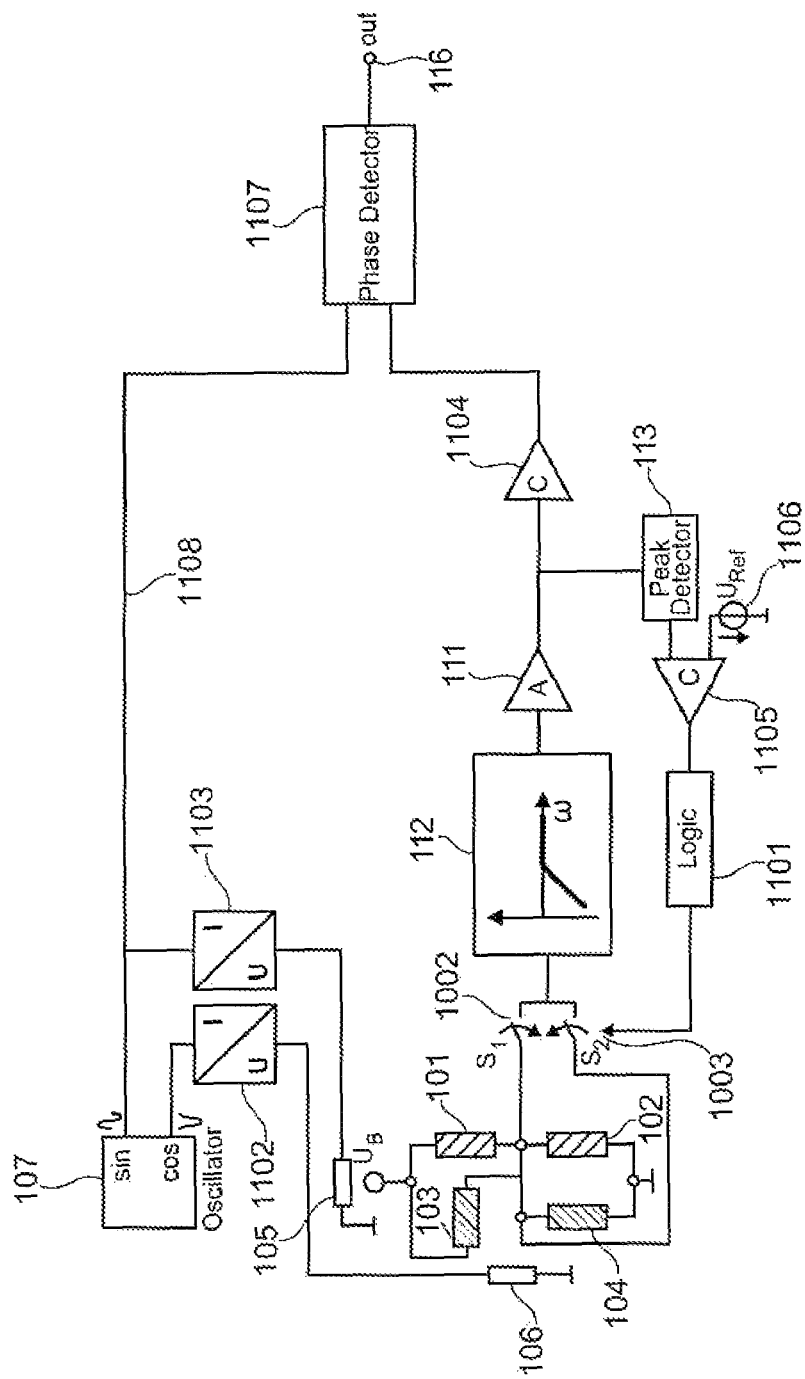
FIG. 11 shows a sensor device for angle calculation with simultaneous coil excitation and evaluation of the phase difference, comprising the sensor of FIG. 8, according to an exemplary embodiment of the present invention.

FIGS. 10 and 11 show two sensor devices for angle calculation, each comprising a sensor element as the one depicted in FIG. 8.

The sensor device depicted in FIG. 10 is adapted for implementation of the following method according to an exemplary embodiment of the present invention. The device comprises, inter alia, two additional switches 1002, 1003, which are controlled by the calculation and control unit 1001 via control line 1005.

The control logic 1001 decides depending on the measured amplitudes, which of the half-bridges is used for evaluation. This half-bridge (either bridge 101, 102 or bridge 103, 104) is then selected via the switches 1002 or 1003 and the external magnetic field angle is calculated by measuring the selected half-bridges amplitudes when alternatingly exciting the integrated coils 105, 106 (via switches 110, 109).

FIG. 11 shows a second sensor device for implementing a method according to another exemplary embodiment of the present invention, in which the two integrated coils 105, 106 are excited simultaneously with sine- and cosine signals, which results in a rotation of the sensed magnetic field vector around the actual external magnetic field vector.

The device comprises, inter alia, voltage-current-converters 1102, 1103 for exciting the coils 106, 105. The output signal from either the first or the second half-bridge (selectable by switches 1002, 1003) is detected by peak detector 113. The output of the peak detector 113 is transmitted to a control logic 1101 via operational amplifier 1105 (which is further connected to a reference voltage 1106). The control logic 1101 selects the half-bridge with the larger amplitude via switches 1002, 1003. The phase difference of the AC part of the signal from this half-bridge to the original excitation signal 1108 is measured after passing the amplifier 1104 by the phase detector 1107. The output signal 116 of the phase detector 1107 is directly equal (or directly corresponds) to the angle of the external magnetic field.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

The invention claimed is:

1. A sensor configured to measure an angle of an external magnetic field, the sensor comprising:
 a first half-bridge comprising a first magnetoresistive resistor and a second magnetoresistive resistor, wherein the first magnetoresistive resistor and the second magnetoresistive resistor have barber-pole stripes;
 a second half-bridge comprising a third magnetoresistive resistor and a fourth magnetoresistive resistor, wherein the third magnetoresistive resistor and the fourth magnetoresistive resistor do not have barber-pole stripes, the third magnetoresistive resistor is rotated with respect to the fourth magnetoresistive resistor by an angle of 90 degrees, and the first magnetoresistive resistor and the second magnetoresistive resistor are arranged parallel to the third magnetoresistive resistor; and
 a modulation unit configured to modulate the external magnetic field with an Alternating Current (AC) field in a continuous manner and generate a magnetic modulation field with both a sine signal and a cosine signal, wherein the external magnetic field is superposed by a rotating magnetic field vector.

2. The sensor of claim 1, wherein the modulation unit comprises:
 a first coil configured to generate the magnetic modulation field in an x-direction; and
 a second coil configured to generate the magnetic modulation field in a y-direction.

3. The sensor of claim 2, wherein the first coil is excited by the sine signal and the second coil is excited by the cosine signal.

4. The sensor of claim 2, further comprising:
 a control unit configured to decide, on the basis of measured peak amplitudes, which one of the two half-bridges is used for calculation of the angle of the external magnetic field.

5. The sensor of claim 2, further comprising:
 a detector configured to measure peak amplitudes which correspond to an output from the two half-bridges; and
 a control unit configured to calculate the angle of the external magnetic field according to $\alpha = \arctan(U1_{pk}/U2_{pk})$, wherein $U1_{pk}$ and $U2_{pk}$ are the measured peak amplitudes.

6. A method for measuring an angle of an external magnetic field, the method comprising:
 modulating the external magnetic field in two directions with an Alternating Current (AC) field in a sensor comprising a first half-bridge and a second half-bridge, the first half-bridge has a first magnetoresistive resistor and a second magnetoresistive resistor, wherein the first magnetoresistive resistor and the second magnetoresistive resistor have barber-pole stripes, and the second half-bridge has a third magnetoresistive resistor and a fourth magnetoresistive resistor, wherein the third magnetoresistive resistor and the fourth magnetoresistive resistor do not have barber-pole stripes, the third magnetoresistive resistor is rotated with respect to the fourth magnetoresistive resistor by an angle of 90 degrees, and the first magnetoresistive resistor and the second magnetoresistive resistor are arranged parallel to the third magnetoresistive resistor; and
 exciting a first coil and a second coil in a continuous manner to generate a magnetic modulation field, wherein the first coil is excited by a sine signal and the second coil is excited by a cosine signal, and the external magnetic field is superposed by a rotating magnetic field vector.

7. The method of claim 6, further comprising:
 generating the magnetic modulation field in an x-direction and in a y-direction.

8. A non-transitory computer-readable medium, in which a computer program for measuring an angle of an external magnetic field is stored which, when executed by a processor, causes the processor to execute a method for measuring an angle of an external magnetic field, the method comprising:
 modulating an Alternating Current (AC) magnetic field in two directions in a sensor comprising a first half-bridge and a second half-bridge, the first half-bridge has a first magnetoresistive resistor and a second magnetoresistive resistor, wherein the first magnetoresistive resistor and a second magnetoresistive resistor have barber-pole stripes, and the second half-bridge has a third magnetoresistive resistor and a fourth magnetoresistive resistor, wherein the third magnetoresistive resistor and the fourth magnetoresistive resistor do not have barber-pole stripes, wherein the third magnetoresistive resistor is rotated with respect to the fourth magnetoresistive resistor by an angle of 90 degrees, and the first magnetoresistive resistor and the second magnetoresistive resistor are arranged parallel to the third magnetoresistive resistor; and
 exciting a modulation unit comprising a first coil and a second coil in a continuous manner for generation of a magnetic modulation field, wherein the first coil is excited by a sine signal and the second coil is excited by a cosine signal, and the external magnetic field is superposed by a rotating magnetic field vector.

9. The sensor of claim 5, wherein the measured peak amplitudes are measured by a peak detector.

10. The sensor of claim 5, wherein the measured peak amplitudes ate measured by a root mean square (RMS) detector.

11. The sensor of claim 2, further comprising:
a first voltage-to-current converter configured to excite the first coil; and
a second voltage-to-current converter configured to excite the second coil.

12. The method of claim 6, further comprising:
measuring resulting AC amplitudes at an output of a Wheatstone bridge.

13. The method of claim 6, further comprising:
filtering an AC part of an output signal with a high pass filter (HPF).

14. The method of claim 6, wherein an AC part of an output signal and the sine signal are both sinusoidal signals.

15. The method of claim 14, wherein the AC part of the output signal has a phase shift compared to the sine signal.

16. The method of claim 15, wherein the phase shift corresponds to the angle of the external magnetic field.

* * * * *